(12) United States Patent
Yanagisawa

(10) Patent No.: US 7,879,532 B2
(45) Date of Patent: Feb. 1, 2011

(54) METHOD OF MANUFACTURING SEMICONDUCTOR DEVICE

(75) Inventor: Masayuki Yanagisawa, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 553 days.

(21) Appl. No.: 11/476,885

(22) Filed: Jun. 29, 2006

(65) Prior Publication Data

US 2007/0009836 A1    Jan. 11, 2007

(30) Foreign Application Priority Data

Jul. 7, 2005    (JP)    ............... 2005-198522

(51) Int. Cl.
  *G03F 7/26*    (2006.01)
(52) U.S. Cl. .................. 430/311; 430/394; 430/313
(58) Field of Classification Search .............. 430/311, 430/313, 323, 394, 322, 5
  See application file for complete search history.

(56) References Cited

U.S. PATENT DOCUMENTS

| 5,753,417 | A | * | 5/1998 | Ulrich ................... 430/312 |
| 5,919,605 | A |   | 7/1999 | Uchiyama |
| 5,972,569 | A | * | 10/1999 | Jeng et al. ................ 430/312 |
| 7,374,866 | B2 | * | 5/2008 | Atkinson et al. ........... 430/313 |
| 2002/0172872 | A1 |   | 11/2002 | Hoshino |

FOREIGN PATENT DOCUMENTS

| JP | 64-31416(A)   | 2/1989  |
| JP | 3-70119(A)    | 3/1991  |
| JP | 7-142309      | 6/1995  |
| JP | 7-248612(A)   | 9/1995  |
| JP | 8-274000(A)   | 10/1996 |
| JP | 9-051022      | 2/1997  |
| JP | 9-330877(A)   | 12/1997 |
| JP | 2000-124280 A | 4/2000  |
| JP | 2001-168102 A | 6/2001  |
| JP | 2004-341513(A)| 11/2002 |

OTHER PUBLICATIONS

English Translation, Yasumasa, JP 2000-124280 (Apr. 28, 2000).*

* cited by examiner

*Primary Examiner*—Kathleen Duda
*Assistant Examiner*—Caleen O Sullivan
(74) *Attorney, Agent, or Firm*—Foley & Lardner LLP

(57) ABSTRACT

A method of manufacturing a semiconductor device includes: (A) providing a wafer to which a photo-resist is applied; (B) forming a reacted portion in the photo-resist by exposing the wafer to a light through a mask having a translucent section, the reacted portion being a portion reacted with the light; and (C) forming a resist mask having an opening portion corresponding to the translucent section by dissolving the reacted portion. The opening portion does not penetrate the photo-resist in a case where an exposure amount in the (B) process is a first exposure amount. On the other hand, the opening portion penetrates the photo-resist in a case where the exposure amount is a second exposure amount larger than the first exposure amount.

23 Claims, 16 Drawing Sheets

Fig. 13
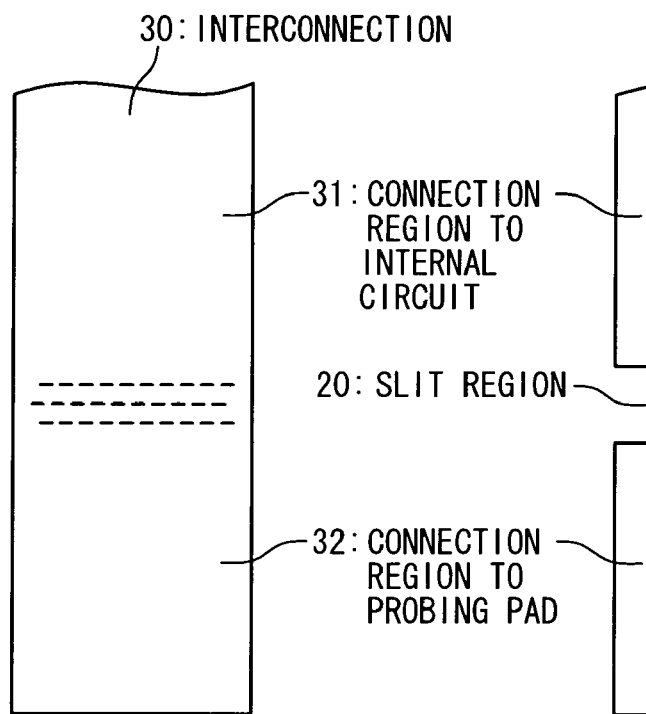
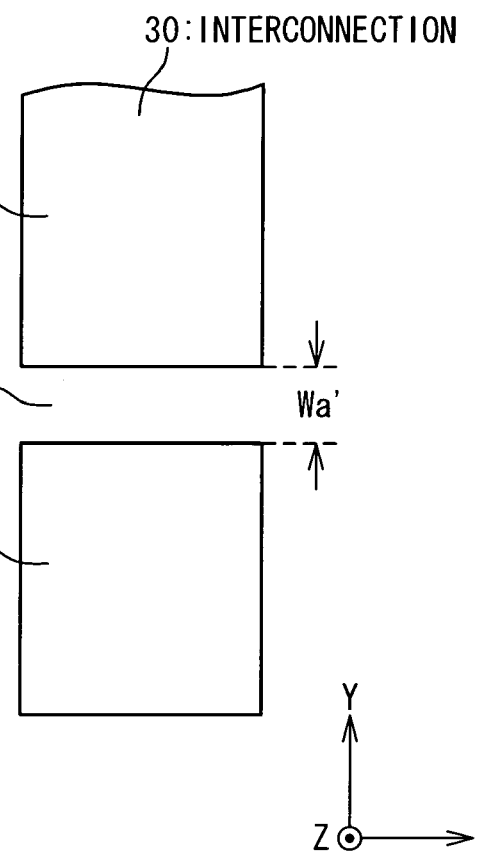

METHOD OF MANUFACTURING SEMICONDUCTOR DEVICE

BACKGROUND OF THE INVENTION

1. Field of the Invention

The present invention relates to a method of manufacturing semiconductor devices. In particular, the present invention relates to a lithography technology using a mask.

2. Description of the Related Art

In a probe test with respect to a wafer provided with a plurality of semiconductor chips, electrical characteristics of the plurality of semiconductor chips are often tested together at a time. At this time, an appropriate test cannot be conducted if any of the chips has a short-circuit failure. In particular, such a short-circuit failure is likely to occur at a power line and a signal line in an unavailable chip (an imperfect chip) which is formed near the edge of the wafer and whose corner is lost. Such an unavailable chip affects the test for adjacent available chips. In addition, when a probe comes in contact with the unavailable chip, a large current may flow through the probe. As a result, the life of a probe card is shortened.

It is therefore necessary to take some measures for the unavailable chips in order to avoid troubles during a wafer probe test. For example, it is necessary with respect to the unavailable chips to make power supply interconnections non-conductive in advance. The following are known as conventional techniques for avoiding troubles in the wafer probe test.

According to a technique described in Japanese Laid Open Patent Application JP-P2000-124280A, a power supply interconnection is cut off prior to a wafer burn-in test. More in detail, an interconnection having a power shutdown section is provided between a bonding pad and a probing pad. Prior to the wafer burn-in test, measurement of consumption current is conducted to search for a semiconductor chip having the short circuit failure. The power shutdown section of a defective semiconductor chip is melted by laser beam irradiation, and thereby the above-mentioned interconnection is cut off electrically.

According to a technique described in Japanese Laid Open Patent Application JP-A-Heisei 9-51022, an insulating film is formed on a semiconductor chip that is confirmed to be defective prior to a wafer probe test. After that, the wafer probe test is conducted at a time for a plurality of semiconductor chips by pressing a probe card against the entire wafer.

In the above-mentioned conventional techniques, a predetermined process with regard to defective semiconductor chips is necessary after a wafer process and before the wafer probe test. That is to say, another process is required in addition to the wafer process and the test process. This leads to an increase in test costs and a decrease in throughput. It is thus desirable that the processing for the defective semiconductor chips is performed during the wafer process.

According to a technique described in Japanese Laid Open Patent Application JP-A-Heisei 7-142309, processing for the unavailable chips formed near the wafer edge is performed in an exposure process during the wafer process. In the exposure process, a pattern is projected from a reticle to a wafer by using an exposure equipment (stepper). Here, as to the chips on the periphery of the wafer, not only a normal exposure (first exposure) but also an additional exposure (second exposure) using another different pattern is performed, which is called a double exposure. For example, the different pattern for the second exposure is made by operating a reticle blind or shifting the position of the reticle. Alternatively, the second exposure may be performed after the above-mentioned reticle is detached from the equipment. Alternatively, another reticle may be prepared for the second exposure. As a result, patterns formed in the chips on the periphery of the wafer are broken. Consequently, the chips on the periphery of the wafer are automatically sorted out as defective pieces in the subsequent wafer probe test. According to this conventional technique, it is necessary to manage the reticle and the reticle blind, which causes a decrease in throughput in the exposure process.

Japanese Laid Open Patent Application JP-P2001-168102A discloses a technique that does not require such a reticle blind operation and the like. According to the conventional technique, a photo-mask with which a "fine interconnection section" is formed is prepared for interconnection formation. In the lithography process, an interconnection pattern is formed from interconnection metal by using the photo-mask and positive resist. In a case of a normal exposure, the above-mentioned "fine interconnection section" is formed. On the other hand, in a case of a double exposure, it is possible to cut off the above-mentioned "fine interconnection section". Alternatively, the "fine interconnection section" is not formed by increasing an exposure amount.

SUMMARY OF THE INVENTION

The present invention has recognized the following points. According to the above-mentioned conventional technique (Japanese Laid Open Patent Application JP-P2001-168102A), the manufactured interconnection has the "fine interconnection section" in the case of the normal exposure. Therefore, when a current flows through the interconnection, the current density at the fine interconnection section is increased. If the current with the current density above a certain level continues to flow through a metal interconnection, metal atoms move due to electro-migration, which causes disconnection of the interconnection. Thus, product reliability is deteriorated.

In an aspect of the present invention, a method of manufacturing a semiconductor device is provided. The method includes: (A) providing a wafer to which a photo-resist is applied; (B) forming a reacted portion in the photo-resist by exposing the wafer to a light through a mask having a translucent section, the reacted portion being a portion reacted with the light; and (C) forming a resist mask having an opening portion corresponding to the translucent section by dissolving the reacted portion. The opening portion does not penetrate the photo-resist in a case where an exposure amount in the (B) process is a first exposure amount. On the other hand, the opening portion penetrates the photo-resist in a case where the exposure amount is a second exposure amount larger than the first exposure amount.

The translucent section of the mask includes, for example, a slit whose longitudinal direction is a second direction orthogonal to a first direction. The light passes through a projection lens with a reduction ratio of 1/R (R is a real number not less than 1) after passing through the mask, and the light is applied to the wafer. Here, a width of the slit in the first direction is smaller than R times the minimum dimension specified in a design rule. Therefore, in a case of the first exposure amount, the opening portion formed in the (C) process does not penetrate the photo-resist because of the lack of exposure amount. On the other hand, the second exposure amount is determined such that the opening portion formed in the (C) process penetrates the photo-resist. The second exposure amount is about twice the first exposure amount. For example, the second exposure amount is achieved by repeating the exposure with the first exposure amount. Alternatively, the second exposure amount may be achieved by repeating an exposure with an exposure amount different from the first exposure amount. Alternatively, a single exposure with the second exposure amount may be performed instead of a multiple exposure.

In a case of interconnection formation, the above-mentioned photo-resist is applied onto an interconnection film formed on the wafer. The interconnection extending in the first direction can be formed by etching the interconnection film by using the resist mask obtained in the above-mentioned (C) process. It should be noted that the opening portion of the resist mask does not reach the interconnection film in the case where the exposure amount is the first exposure amount. As a result, the slit of the translucent section is not reflected at all in the manufactured interconnection. On the other hand, the opening portion of the resist mask reaches the interconnection film in the case where the exposure amount is the second exposure amount (over-exposure). As a result, the manufactured interconnection is disconnected at a portion corresponding to the opening portion.

As described above, in the case of the over-exposure with the second exposure amount, the slit of the translucent section is reflected in the resist mask and hence the interconnection is disconnected (cut off). It is thus possible in the wafer process prior to the wafer probe test to make an interconnection at a predetermined position in the unavailable chip non-conductive. As a result, the problem during the wafer probe test can be solved.

On the other hand, in the case of the normal exposure with the first exposure amount, the slit of the translucent section is not reflected at all in the manufactured interconnection. In other words, it is possible to form the interconnection with a full width in the available chip. The above-mentioned "fine interconnection section" is not formed. Since a part of the power supply interconnection does not become thin, the disconnection due to the electro-migration can be prevented. It is therefore possible to prevent the deterioration of the product reliability. Furthermore, the decrease in the throughput is prevented since the change of the reticle and the operation of the reticle blind are not necessary.

According to the lithography technology of the present invention, it is possible to disconnect (cut off) the interconnection in the unavailable chip formed on the wafer, during the wafer process. Consequently, the troubles during the wafer probe test are avoided. Moreover, the product reliability is improved since the electro-migration is prevented. Furthermore, the decrease in the throughput is prevented because the reticle operation is not necessary.

BRIEF DESCRIPTION OF THE DRAWINGS

The above and other objects, advantages and features of the present invention will be more apparent from the following description taken in conjunction with the accompanying drawings, in which:

FIG. 13 is a plan view showing interconnections manufactured in the third embodiment of the present invention;

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the present embodiments illustrated for explanatory purposed.

Figure 1:
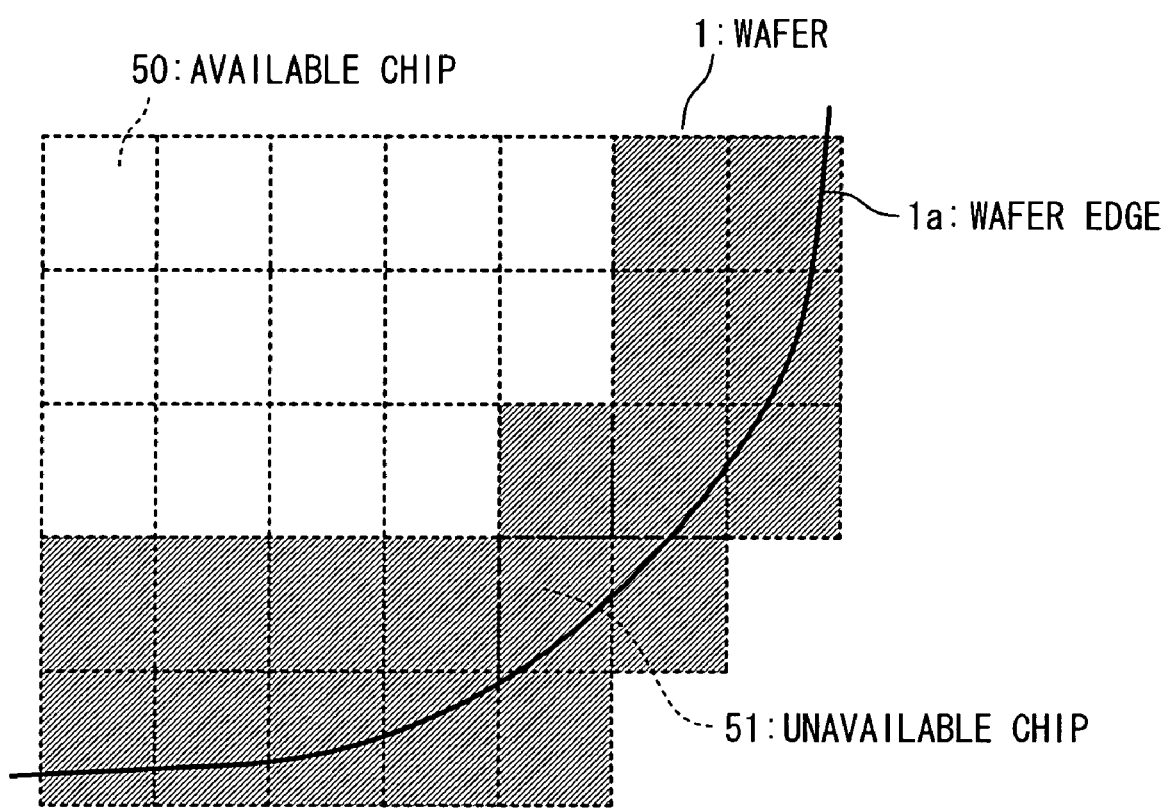
FIG. 1 is a plan view showing a wafer according to the present invention.

FIG. 1 is a plan view showing a wafer 1 according to an embodiment of the present invention. A plurality of semiconductor chips are formed in an array form on the wafer 1. The plurality of semiconductor chips include available chips 50 and unavailable chips 51. The unavailable chip 51 is exemplified by an imperfect chip that is located on a wafer edge 1a and whose corner is lost. The unavailable chip 51 is also exemplified by a chip formed in a belt region on the periphery of the wafer 1 where processing is not uniformly performed during a film-depositing process and an etching process for example. On the other hand, the available chip 50 is a perfect semiconductor chip and is formed in the inner region of the wafer 1 as compared with the unavailable chips 51. Since a short-circuit failure is likely to occur at a power line in the unavailable chip 51, it is desirable to make the power line non-conductive during the wafer process. The present invention provides a lithography technology for disconnecting an interconnection such as the power line in the unavailable chip 51.

Figure 2:
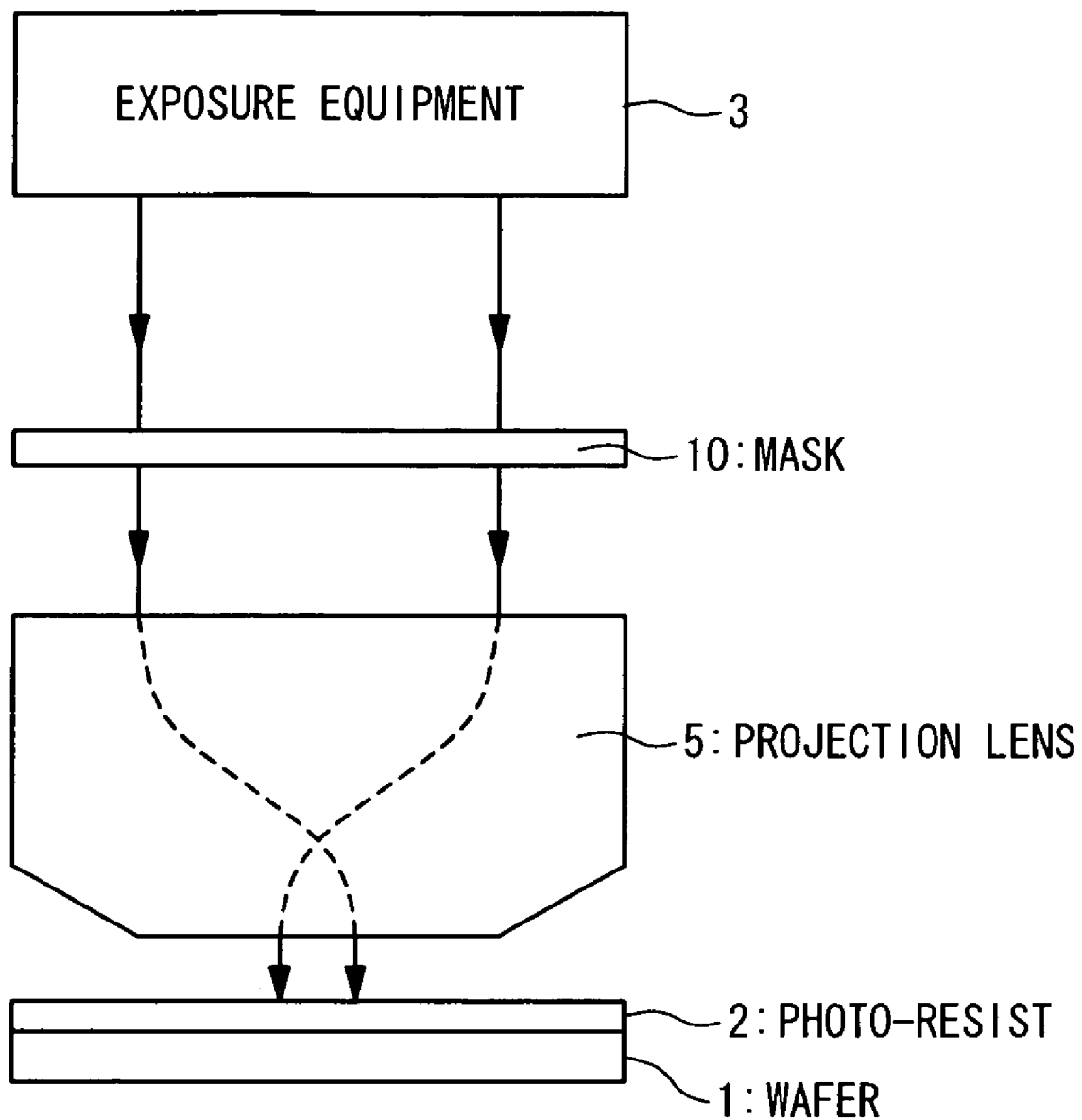
FIG. 2 is a schematic diagram showing an equipment used in manufacturing a semiconductor device according to the present invention.

FIG. 2 schematically shows an equipment (stepper) used in a lithography process (exposure process) according to the present embodiment. As shown in FIG. 2, photo-resist 2 is applied onto the wafer 1. The wafer 1 with the photo-resist 2 is exposed to a light from an exposure equipment 3 through a mask (reticle) 10 and a projection lens 5. That is, the light output from the exposure equipment 3 is supplied to the photo-resist 2 through the mask 10 and the projection lens 5. The optical reduction ratio of the projection lens 5 is 1/R (R is a real number not less than 1). The mask (reticle) 10 is provided between the exposure equipment 3 and the projection lens 5. The mask 10 is fabricated to have a "shading section" which intercepts the light and a "translucent section" which transmits the light. For example, metal such as Cr formed on a glass substrate serves as the shading section, and the other section serves as the translucent section. The shading section and the translucent section are designed to have a pattern that is obtained by enlarging a desired circuit pattern on the wafer 1 by R times. Light having passed through the translucent section of the mask 10 is supplied to the wafer 1 through the projection lens 5 with the reduction ratio of 1/R. As a result, the desired circuit pattern is projected onto the wafer 1 (photo-resist 2).

Detailed description will be given below on a method of disconnecting an interconnection in the unavailable chip 51 during the wafer process.

First Embodiment

Figure 3:
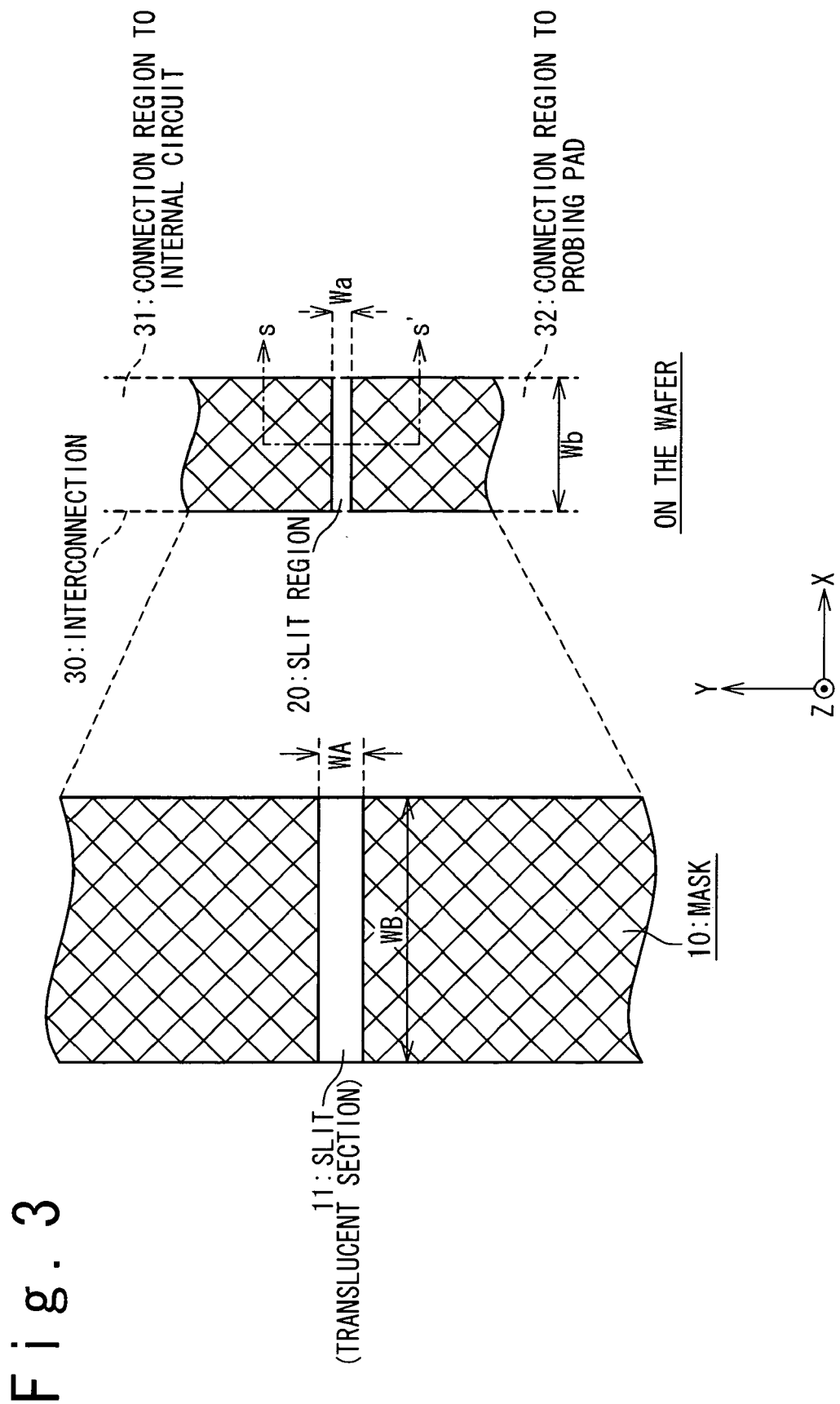
FIG. 3 is a plan view showing a mask and a pattern projected onto a wafer according to a first embodiment of the present invention.

FIG. 3 is a plan view showing the mask 10 and a pattern projected onto the wafer according to a first embodiment. The mask 10 in the present embodiment has a slit 11 as the translucent section which transmits the light. A longitudinal direction of the slit 11 is an X-direction. The light passing through the slit 11 is supplied to a slit region 20 on the wafer through the projection lens shown in FIG. 2. That is, the slit region 20 is a region on the wafer that corresponds to the slit 11 of the mask 10.

The mask 10 according to the present embodiment is a mask for forming an interconnection 30 which extends in a Y-direction orthogonal to the X-direction. The interconnection 30 is a power supply interconnection used in a wafer probe test, and has a connection region 31 to an internal circuit and a connection region 32 to a probing pad. The probing pad is in contact with a probe in the wafer probe test. As shown in FIG. 3, the mask 10 is arranged such that the slit region 20 is located between the connection regions 31 and 32.

As shown in FIG. 3, the slit region 20 completely crosses the interconnection 30 to be formed. That is to say, a width Wb in the X-direction of the slit region 20 is equal to a width in the X-direction of the interconnection 30 to be formed. In other words, a width WB in the X-direction of the slit 11 is substantially equal to R times the width in the X-direction of the interconnection 30 to be formed. On the other hand, a width Wa in the Y-direction of the slit region 20 is smaller than the "minimum dimension" specified in the design rule. In other words, a width WA in the Y-direction of the slit 11 is smaller than R times the minimum dimension. Here, the minimum dimension means a minimum length used in designing a layout of a semiconductor device. Generally, the minimum dimension is given by an interval between interconnections, a gate length of a transistor, and so on.

Figure 4:
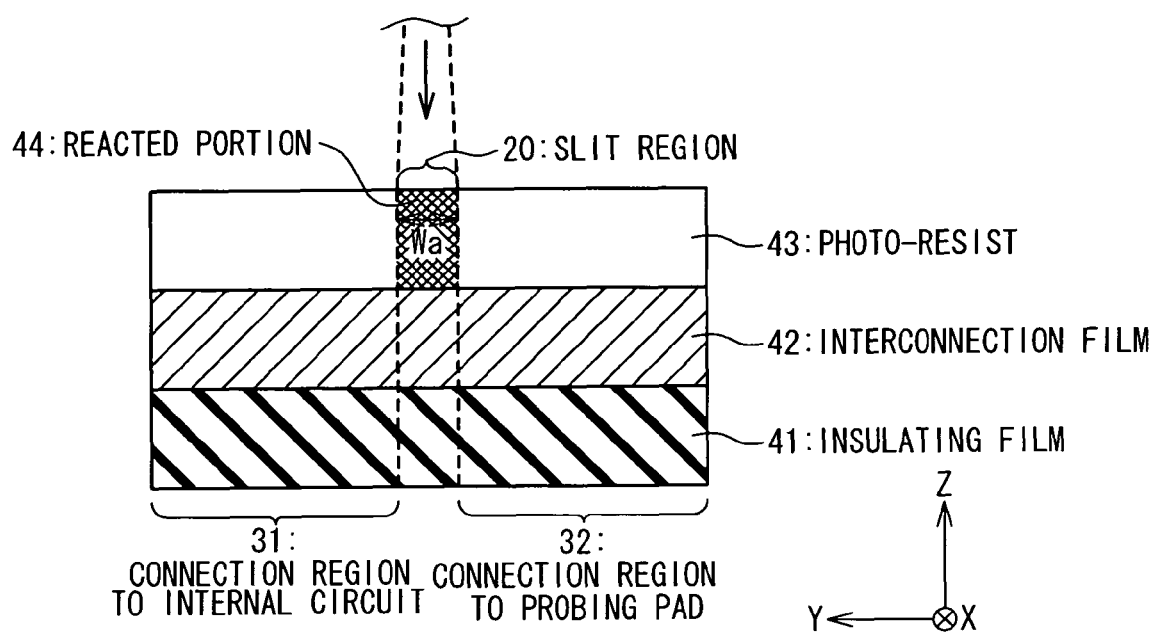
FIG. 4 is a cross-sectional view showing a structure along a line s-s' in FIG. 3.

A cross-sectional structure along a line s-s' in FIG. 3 is illustrated in FIG. 4. Shown in FIG. 4 is the cross-sectional structure before the interconnection 30 in FIG. 3 is manufactured. More specifically, an interconnection film 42, which is a metal film, is formed on an insulating film 41, and photo-resist 43 is applied onto the interconnection film 42. The photo-resist 43 in the slit region 20 is exposed to the light, and thus property of the exposed photo-resist 43 is changed. The portion whose property is changed is hereinafter referred to as a "reacted portion 44". In a case where the photo-resist 43 is positive resist, the reacted portion 44 is rendered soluble. A width along the Y-direction of the reacted portion 44 is substantially equal to the width Wa along the Y-direction of the slit region 20.

Figure 5:
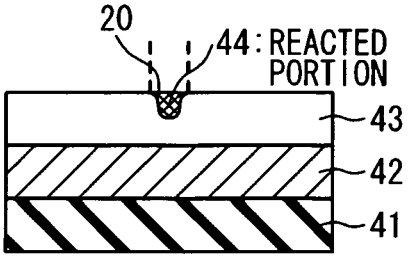
FIG. 5 shows a lithography process according to the first embodiment of the present invention.

FIG. 5 concisely illustrates the lithography technology according to the present embodiment. After the wafer where the photo-resist 43 is applied onto the interconnection film 42 is provided, the photo-resist 43 is exposed to the light through the mask 10 shown in FIG. 3 (EXPOSURE). Consequently, the reacted portion 44 which is reacted with the light is formed in the photo-resist 43. In the case of the positive resist, the reacted portion 44 is soluble. Next, the reacted portion 44 is dissolved by using developing solution (DEVELOPMENT). The removed reacted portion 44 then becomes an opening portion 46. The opening portion 46 corresponds to the slit region 20. The photo-resist 43 to which the opening portion 46 is formed is hereinafter referred to as a "resist mask 45". Next, etching of the interconnection film 42 is performed by using the resist mask 45 (PROCESS). Lastly, the resist mask 45 is removed (REMOVAL).

According to the present embodiment, the width Wa of the slit region 20 is smaller than the minimum dimension, as mentioned above. As shown in FIG. 5, in a case of a normal exposure amount (first exposure amount), the reacted portion 44 does not penetrate the photo-resist 43 due to a lack of the exposure amount. In other words, the opening portion 46 does not reach the interconnection film 42. When the etching is performed by the use of the resist mask 45 having such the opening portion 46, the pattern corresponding to the slit region 20 is not formed to the interconnection film 42.

If the exposure amount in the exposure process is increased from the normal first exposure amount, the formed reacted portion 44 becomes deeper. Then, the reacted portion 44 penetrates the photo-resist 43 with a certain exposure amount (second exposure amount) larger than the first exposure amount. That is to say, the opening portion 46 reaches the interconnection film 42 as shown in FIG. 5. By the etching through such the opening portion 46, a portion of the interconnection film 42 corresponding to the slit region 20 is removed. In other words, a pattern corresponding to the slit region 20 is developed and formed to the interconnection film 42.

The second exposure amount can be achieved by increasing exposure intensity or/and exposure time. For example, the exposure with the first exposure amount (normal exposure amount) may be performed for two times. In this case, the second exposure amount is approximately twice the first exposure amount. Alternatively, the second exposure amount may be achieved by repeating an exposure with an exposure amount different from the first exposure amount. Such repeated exposure is hereinafter referred to as a "multiple-exposure". Instead of the multiple-exposure, the second exposure amount can be also achieved by a single exposure with the second exposure amount. The exposure with the second exposure amount is hereinafter referred to as "over-exposure", irrespective of the number of exposure steps.

Figure 6:
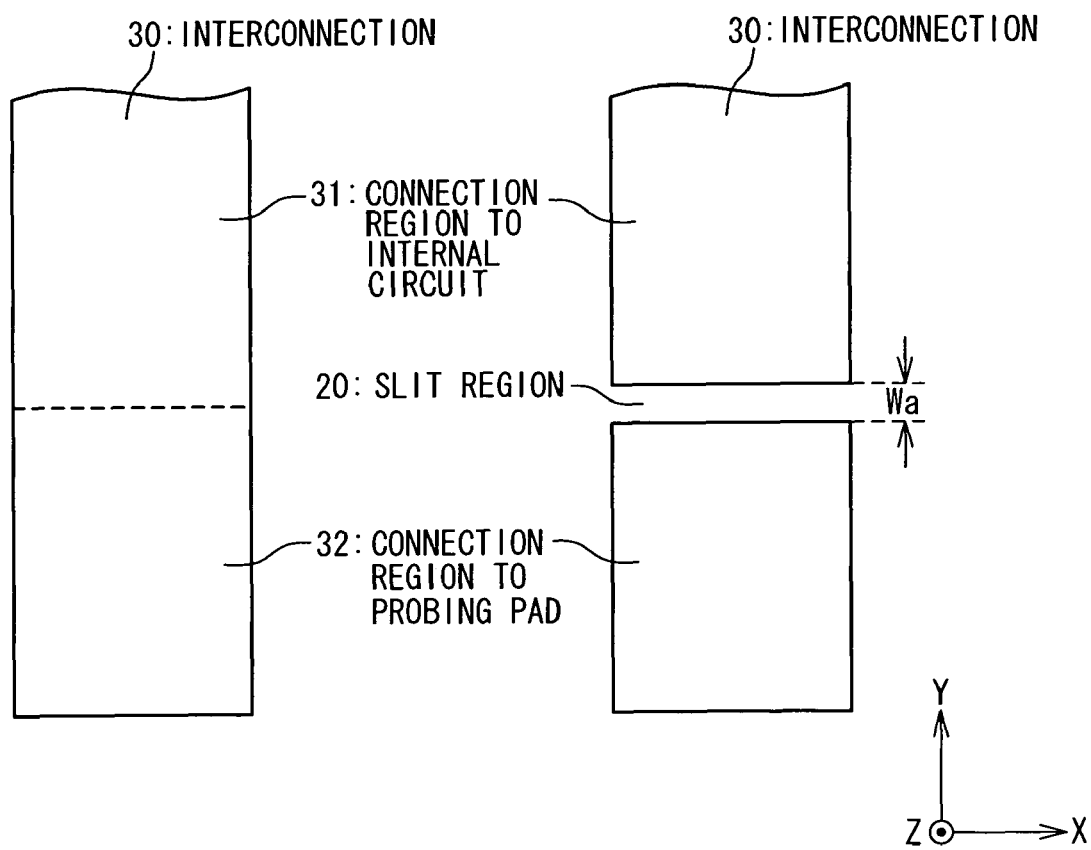
FIG. 6 is a plan view showing interconnections manufactured in the first embodiment of the present invention.

FIG. 6 shows the interconnection 30 which is formed as a result of the lithography process according to the present embodiment. In the case of the normal exposure with the first exposure amount, the interconnection 30 is formed without disconnection. The reason is that the slit 11 of the mask 10 shown in FIG. 3 does not affect the interconnection 30 to be formed, namely, the slit 11 is not reflected at all in the manufactured interconnection 30, in the case of the normal exposure. Moreover, the conventional "fine interconnection section" is not necessary according to the present embodiment. It is possible to form the interconnection 30 with a full width. Since a part of the interconnection 30 does not become thin, the disconnection due to the electro-migration can be prevented, which improves the product reliability.

On the other hand, in the case of the over-exposure with the second exposure amount, the interconnection 30 is disconnected (cut off) at the slit region 20 between the connection regions 31 and 32, as shown in FIG. 6. The reason is that the slit 11 of the mask 10 shown in FIG. 3 is reflected in the interconnection 30 to be formed. Since the interconnection 30 used in the probe test is disconnected, the problem during the probe test can be solved.

According to the present embodiment as explained above, the width WA of the slit 11 is determined such that the interconnection 30 is not disconnected at the time of the normal exposure and the interconnection 30 is disconnected at the time of the over-exposure. More specifically, the width WA of the slit 11 of the mask 10 is set to be smaller than R times the minimum dimension. By using the above-mentioned mask 10 and appropriately performing the normal exposure or the over-exposure, it is possible to select the connection or the disconnection of the manufactured interconnection 30. As to the available chips 50 shown in FIG. 1, the normal exposure with the first exposure amount should be applied. On the other hand, as to the unavailable chips 51, the over-exposure (e.g. the multiple-exposure) with the second exposure amount should be applied. It is thus possible to selectively disconnect only the interconnection 30 in the unavailable chips 51.

Figure 7:
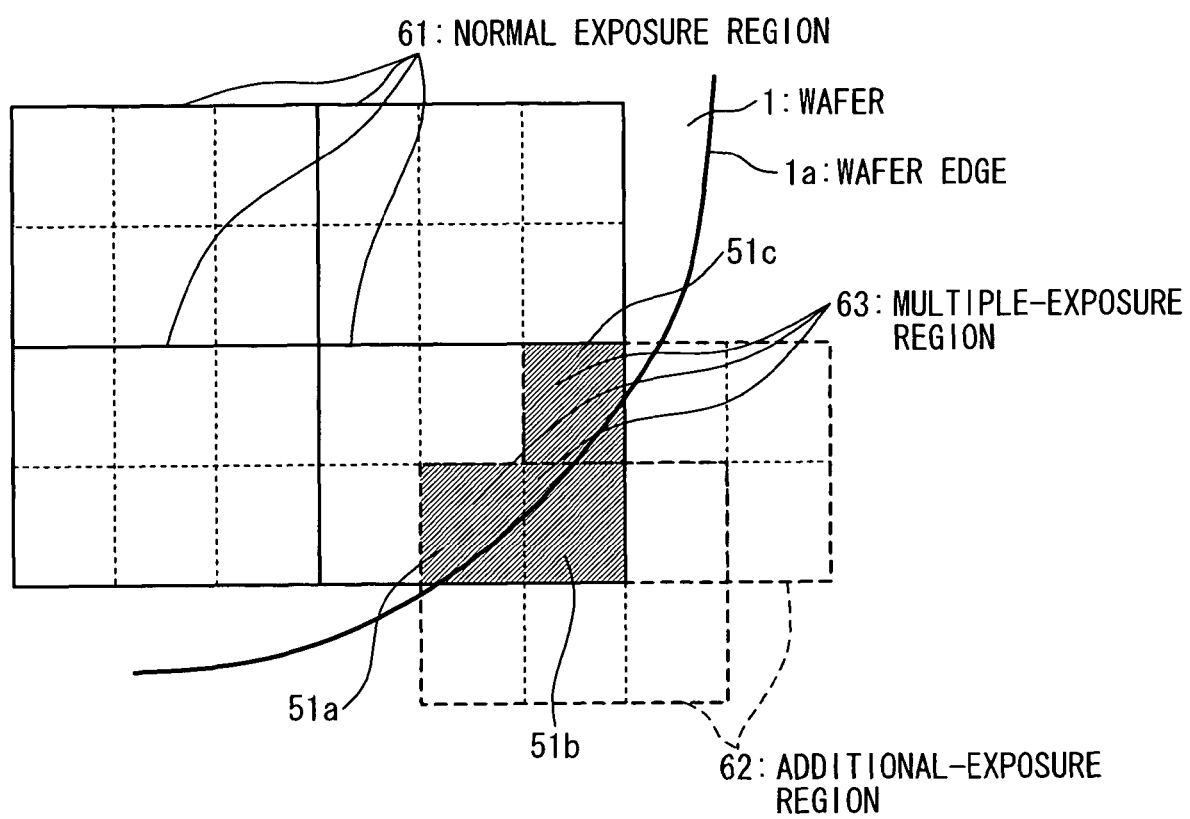
FIG. 7 is a plan view for explaining a method of the over-exposure according to the present invention.

With reference to FIG. 7, description is given on one method of performing the multiple-exposure for the unavailable chips 51 selectively. FIG. 7 corresponds to FIG. 1, where, as an example, the multiple-exposure is performed for unavailable chips 51a to 51c located on the wafer edge 1a. The multiple-exposure for the other unavailable chips 51 shown in FIG. 1 can be performed in the same way. Here, a unit region for one exposure includes six (two times three) semiconductor chips. In FIG. 7, a region where the normal exposure is performed is indicated as a normal exposure region 61. Further, a region where the unavailable chips 51a to 51c are formed and the multiple-exposure is performed is indicated as a multiple-exposure region 63.

First, the normal exposure with the first exposure amount is performed with respect to the entire wafer 1. Next, the normal exposure is performed again with respect to an additional-exposure region 62 shown in FIG. 7. At this time, an exposure target region is controlled to shift by an integer times the chip size. Due to the additional-exposure, the exposure amount with respect to the multiple-exposure region 63 is increased. As a result, only the interconnections 30 in the unavailable chips 51a to 51c are selectively disconnected (cut off). On the other hand, the interconnections 30 in the chips in the normal exposure region 61 are not disconnected, since the proper exposure is performed with respect to the normal exposure region 61.

According to the method exemplified above, it is possible to use the same mask 10 (reticle). It is not necessary to prepare another reticle for the multiple-exposure, which is different from the conventional technique. Moreover, the multiple-exposure for the multiple-exposure region 63 can be achieved by simply shifting the exposure target region by an integer times the chip size. Therefore, it is not necessary to change the setting of a reticle blind. As described above, there is no need to change the reticle and to operate the reticle blind, and thus the decrease in the throughput is prevented.

Figure 8:
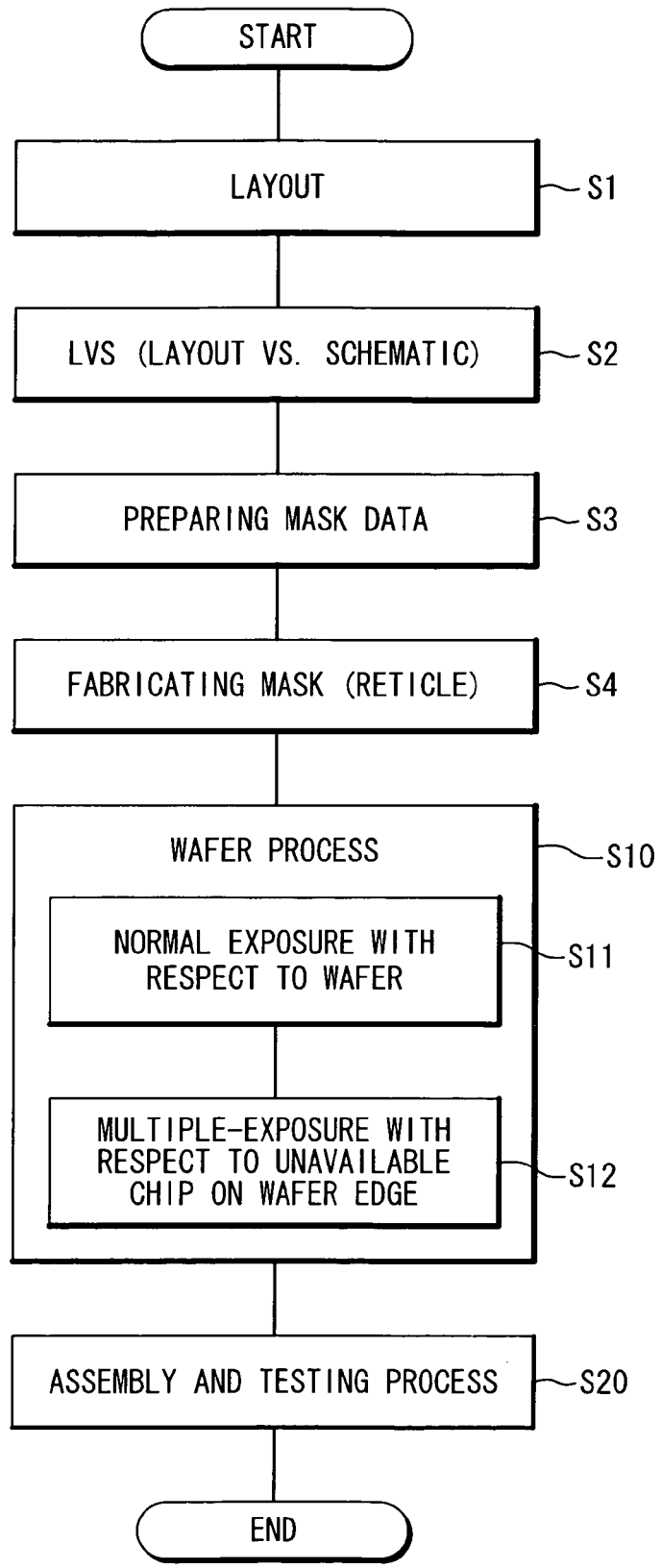
FIG. 8 is a flow chart briefly showing a method of manufacturing a semiconductor device according to the present invention.

FIG. 8 is a flow chart briefly showing a method of manufacturing a semiconductor device including the method explained above. First, a layout of a circuit described in a netlist is determined with the use of a computer and a layout data is generated (Step S1). Next, the layout verification (LVS: Layout vs. Schematic) is conducted (Step S2). In the LVS, it is examined whether the generated layout data accords with a connection relationship described in the netlist. Next, a mask data (EB data) for manufacturing the mask 10 is generated based on the obtained layout data (Step S3). Next, an electron beam lithography system manufactures the mask 10 (reticle) by interpreting the mask data (Step S4).

According to the present embodiment, the mask 10 is fabricated to have the slit 11 (see FIG. 3) for disconnecting the interconnection 30. Therefore, the slit 11 should be reflected in the above-mentioned mask data as well. For this reason, the interconnection 30 is laid-out to have a very fine disconnected section in the layout step (Step S1). In this case however, errors may occur at the LVS (Step S2) because the layout data does not accord with the netlist. As one example of solving the problem, it is useful to insert an LVS-dedicated data, which makes the layout interconnection unbroken and is not reflected to the actual mask 10, into the layout data.

Referring again to FIG. 8, a wafer process (diffusion process) with respect to the wafer 1 is started (Step S10), after the Step S4. Specifically, the normal exposure is performed with respect to the wafer 1 by the use of the exposure equipment shown in FIG. 2 (Step S11). Also, the multiple-exposure is performed with respect to the unavailable chips 51 shown in FIG. 1 (Step S12). After that, a wafer probe test is conducted to test electrical characteristics of the plurality of semiconductor chips together at a time. Then, an assembly and testing process is performed (Step S20).

As described above, in the case of the over-exposure with the second exposure amount, the slit 11 is reflected in the resist mask 45 and hence the interconnection 30 is disconnected. It is thus possible in the wafer process prior to the wafer probe test to make the interconnection 30 in the unavailable chip 51 non-conductive. As a result, the problem during the wafer probe test can be solved. On the other hand, in the case of the normal exposure with the first exposure amount, the slit 11 is not reflected at all in the manufactured interconnection 30. In other words, it is possible to form the interconnection 30 with the full width in the available chip 50. Since a part of the power supply interconnection does not become thin, the disconnection due to the electro-migration can be prevented. It is therefore possible to prevent the deterioration of the product reliability. Furthermore, the decrease in the throughput is prevented since the change of the reticle and the operation of the reticle blind are not necessary.

Second Embodiment

Figure 9:
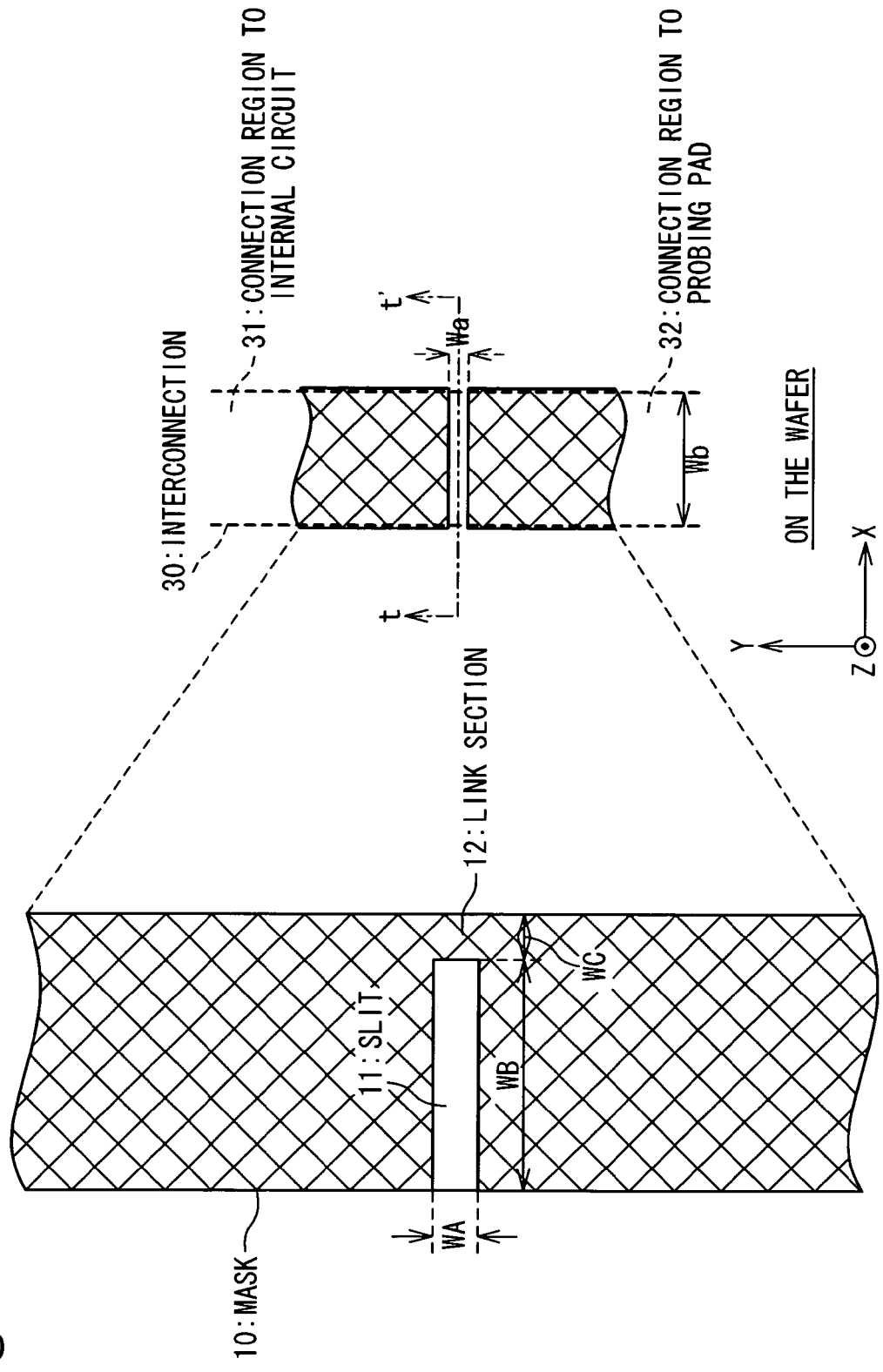
FIG. 9 is a plan view showing a mask and a pattern projected onto a wafer according to a second embodiment of the present invention.

In a second embodiment of the present invention, the above-mentioned problem in the LVS can be solved. FIG. 9 is a plan view illustrating a mask 10 and a pattern projected onto the wafer 1 according to the second embodiment. In FIG. 9, the same reference numerals are given to the same components as those in FIG. 3, and description thereof is appropriately omitted.

The mask 10 in the present embodiment has a link section 12 as the shading section intercepting the light in addition to the slit 11 as the translucent section transmitting the light. The link section 12 and the slit 11 are aligned along the X-direction. The link section 12 is a member for preventing the mask 10 from being divided and is formed to cross the slit 11. That is, the slit 11 is provided partially, and the width WB in the X-direction of the slit 11 is smaller than R times the width Wb in the X-direction of the interconnection 30. The width WA in the Y-direction of the slit 11 is the same as that in the first embodiment, and is smaller than R times the minimum dimension specified in the design rule. Furthermore, according to the present embodiment, a width WC in the X-direction of the link section 12 is also smaller than R times the minimum dimension specified in the design rule.

Since the link section 12 is the shading section which intercepts the light, a lower part from the link section 12 is masked. However, the masking effect by the link section 12 becomes smaller due to light diffraction and so on. In the case of the over-exposure with the second exposure amount in particular, the masking effect by the link section 12 completely disappears since the width WC is smaller than R times the minimum dimension. As to the slit 11, the pattern corresponding to the slit 11 is formed to the interconnection 30 in the case of the over-exposure, as shown in the first embodiment.

Figure 10:
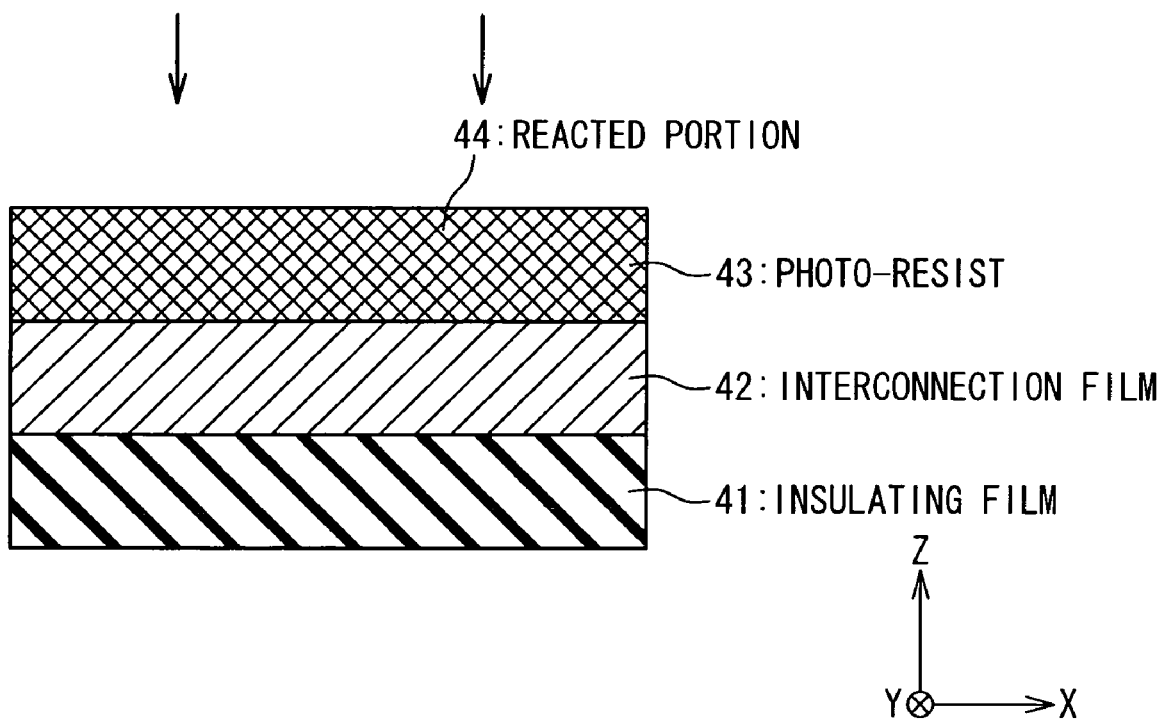
FIG. 10 is a cross-sectional view showing a structure along a line t-t' in FIG. 9.

FIG. 10 shows a cross-sectional structure along a line t-t' in FIG. 9. More specifically, FIG. 10 shows the cross-sectional structure before the interconnection 30 in FIG. 9 is manufactured and in the case of the over-exposure. An interconnection film 42, which is a metal film, is formed on an insulating film 41, and photo-resist 43 is applied onto the interconnection film 42. As in the case of the first embodiment, a portion of the photo-resist 43 which reacts with the light changes into a reacted portion 44. As shown in FIG. 10, the photo-resist 43 along the line t-t' all changes into the reacted portion 44 in the case of the over-exposure. This is because the masking effect by the link section 12 completely disappears at the time of the over-exposure. As a result, the opening portion 46 along the line t-t' is formed (see FIG. 5), and the interconnection film 42 is removed along the line t-t' through the etching.

It should be noted that in the case of the normal exposure, the slit 11 has no effect on the interconnection 30 to be formed, as explained in the first embodiment. The link section 12 also has no effect on the interconnection 30 to be formed, because it is the shading section. Therefore, the interconnection 30 is not disconnected in the case of the normal exposure.

As described above, the resulting structure of the interconnection 30 in the present embodiment is the same as that in the first embodiment (see FIG. 6), although the form of the mask 10 used in the present embodiment (see FIG. 9) is different from that in the first embodiment (see FIG. 3). In the case of the normal exposure, the interconnection 30 is formed without disconnection and with the full width. Since a part of the interconnection 30 does not become thin, the disconnection due to the electro-migration can be prevented, which improves the product reliability. In the case of the over-exposure on the other hand, the interconnection 30 is disconnected at a portion corresponding to the slit region 20 between the connection regions 31 and 32. Since the interconnection 30 used in the probe test is disconnected, the problems during the probe test are avoided. The normal exposure is applied to the available chips 50 and the over-exposure (e.g. the multiple-exposure) is applied to the unavailable chips 51.

According to the second embodiment of the present invention, the same effect as in first embodiment can be obtained. Moreover, according to the present embodiment, an additional effect can be obtained that the error in the layout verification (LVS) is avoided. The reason is that the mask 10 in the present embodiment has the link section 12. Because of the presence of the link section 12, the connection region 31 to the internal circuit and the connection region 32 to the probing pad are electrically connected in the layout step (Step S1). Therefore, the layout data generated in the Step S1 accords with the connection relationship described in the netlist.

Figure 11:
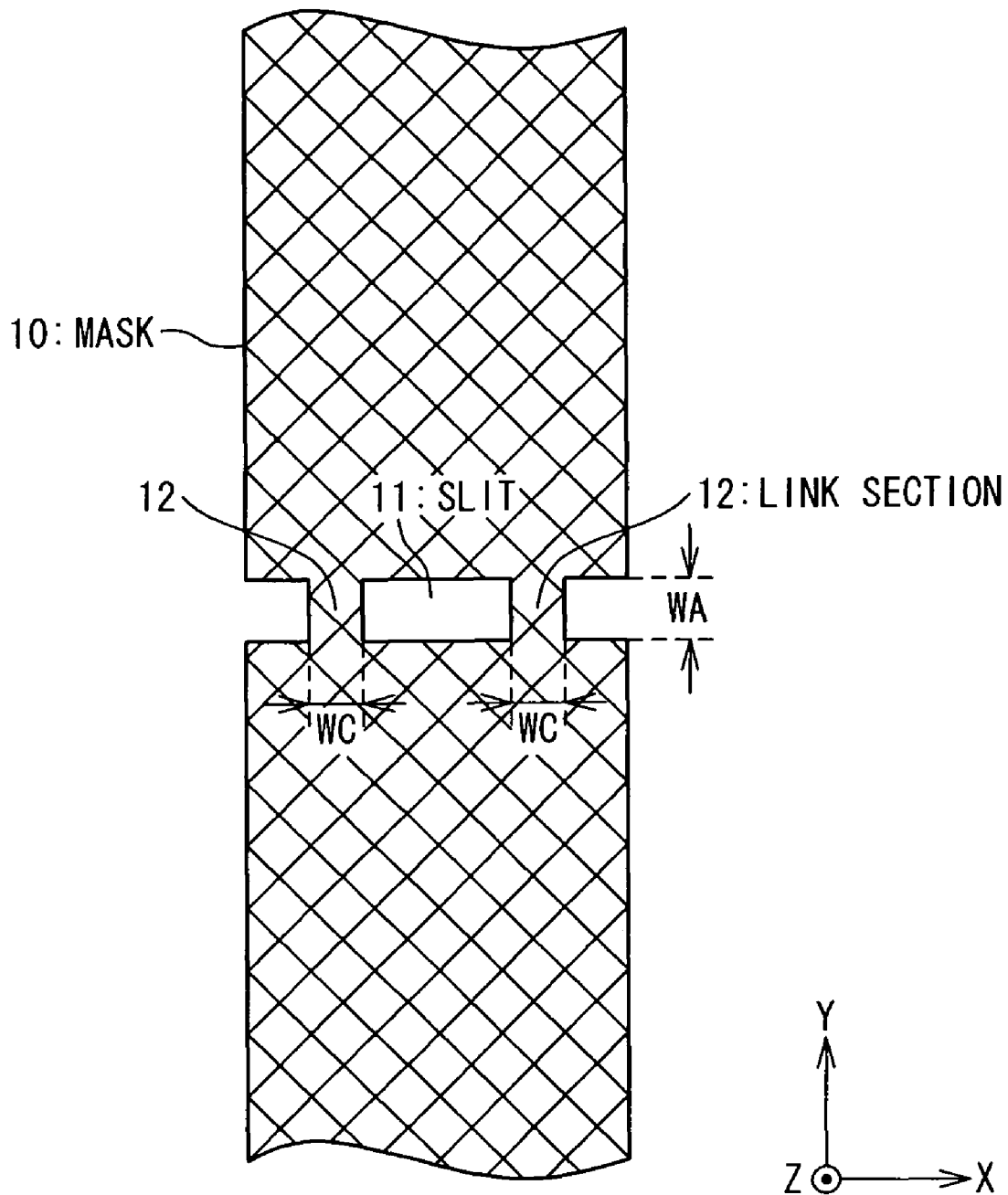
FIG. 11 is a plan view showing a modification example of a mask according to the second embodiment of the present invention.

It should be noted that the position and the number of the link section 12 are not limited to those shown in FIG. 9. FIG. 11 shows a modification example of the mask 10 according to the present embodiment. As shown in FIG. 11, link sections 12 are formed to cross the slit 11 at arbitrary positions. The number of the link sections 12 can be two or above. The width WC in the X-direction of each link section 12 is designed to be smaller than R times the minimum dimension.

Third Embodiment

Figure 12:
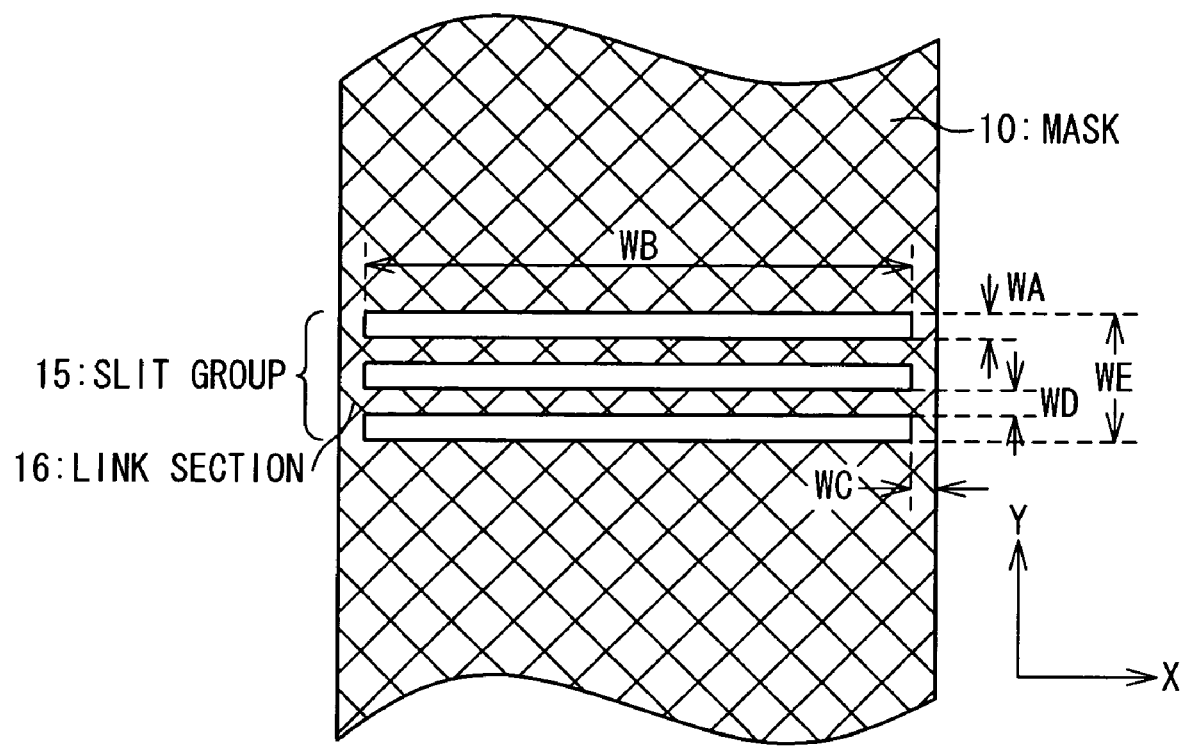
FIG. 12 is a plan view showing a mask according to a third embodiment of the present invention.

In the present invention, the number of slits is not limited to one. FIG. 12 is a plan view showing a structure of a mask according to a third embodiment of the present invention. As shown in FIG. 12, the mask 10 in the present embodiment has a slit group 15 as the translucent section which transmits the light. The slit group 15 includes a plurality of slits arranged in parallel, where the longitudinal direction of each slit is the X-direction. As in the case of the foregoing embodiments, the width WA in the Y-direction of each slit is smaller than R times the minimum dimension specified in the design rule. In the case of the normal exposure therefore, the slit group 15 does not affect the interconnection 30 to be formed (see FIG. 13), as in the case of the foregoing embodiments. In the case of the over-exposure on the other hand, the slit group 15 is developed and reflected in the interconnection 30 to be formed.

As shown in FIG. 12, the mask 10 in the present embodiment further has a link section 16 similar to the link section in the second embodiment. The link section 16 is formed to cross the plurality of slits. The width WC in the X-direction of the link section 16 is designed to be smaller than R times the minimum dimension. In the case of the over-exposure therefore, the effect of the link section 16 on the interconnection 30 disappears as in the case of the second embodiment.

It is preferable in the present embodiment that a width WD between adjacent slits is also designed to be smaller than R times the minimum dimension. In this case, the influence of a portion between the adjacent slits on the interconnection 30 also disappears in the case of the over-exposure, for the same reason as the link section 16. Consequent effect will be explained with reference to FIG. 13.

FIG. 13 illustrates the interconnections 30 formed in the present embodiment. In the case of the over-exposure with the second exposure amount, the slit regions 20 on the wafer (corresponding to the disconnected portions of the interconnection 30) come together as one. This is because the link section 16 and the portion between the adjacent slits shown in FIG. 12 are not reflected in the manufactured interconnection 30, as mentioned above. Therefore, the slit regions 20 converge into one on the wafer, although the plurality of slits are provided on the mask 10. As a result, a width Wa' of the one slit region 20 becomes larger than the width Wa shown in FIG. 6 in the above embodiment. It is thus possible to well perform the etching and to disconnect the interconnection 30 more surely.

More in detail, the width Wa of the slit region 20 is approximately the minimum dimension in the foregoing embodiments. In this case, residue may occur in the etching process due to decrease in the etching speed. The etching residue leads to a short of the interconnection 30. According to the present embodiment, however, the width Wa' of the one slit region 20 becomes larger than the width Wa of the slit region 20 in the foregoing embodiments, namely, becomes sufficiently larger than the minimum dimension. Therefore, the residue in the etching process due to the decrease in the etching speed is avoided. That is, it is possible to disconnect the interconnection 30 more surely. From this point of view, it is preferable that a width WE (see FIG. 12) in the Y-direction of whole of the slit group 15 is larger than R times the minimum dimension.

According to the third embodiment, as explained above, the same effect as that in the first embodiment can be obtained. Moreover, the same effect as that in the second embodiment can be also obtained because of the presence of the link section 16. In other words, error occurrence in the layout verification (LVS) can be avoided. Furthermore, according to the present embodiment, an additional effect can be obtained that the interconnection 30 is surely disconnected at the time of the over-exposure.

Modification Examples

Figure 14:
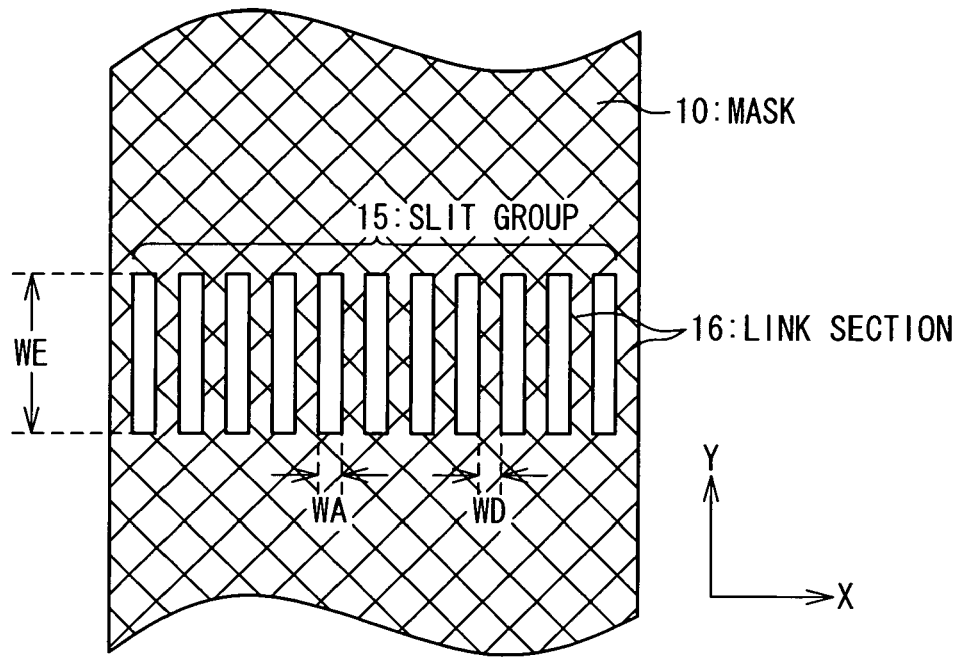
FIG. 14 is a plan view showing a modification example of a mask according to the third embodiment of the present invention.

FIG. 14 is a plan view showing a modification example of the mask 10 according to the third embodiment. The mask 10 in the present modification example also has the slit group 15 which includes a plurality of slits arranged parallel to each other. Here, the longitudinal direction of each slit is the Y-direction. Therefore, a portion between adjacent slits serves as the link section 16. A width WA in the X-direction of each slit is smaller than R times the minimum dimension. A width WD between the adjacent slits, namely a width in the X-direction of the link section 16 is also smaller than R times the minimum dimension. A width WE in the Y-direction of whole of the slit group 15 corresponds to a length of each slit in the longitudinal direction. It is preferable that the width WE is sufficiently larger than R times the minimum dimension. With the present modification example, the same effect as in the case of the mask 10 shown in FIG. 12 can be also obtained.

Figure 15:
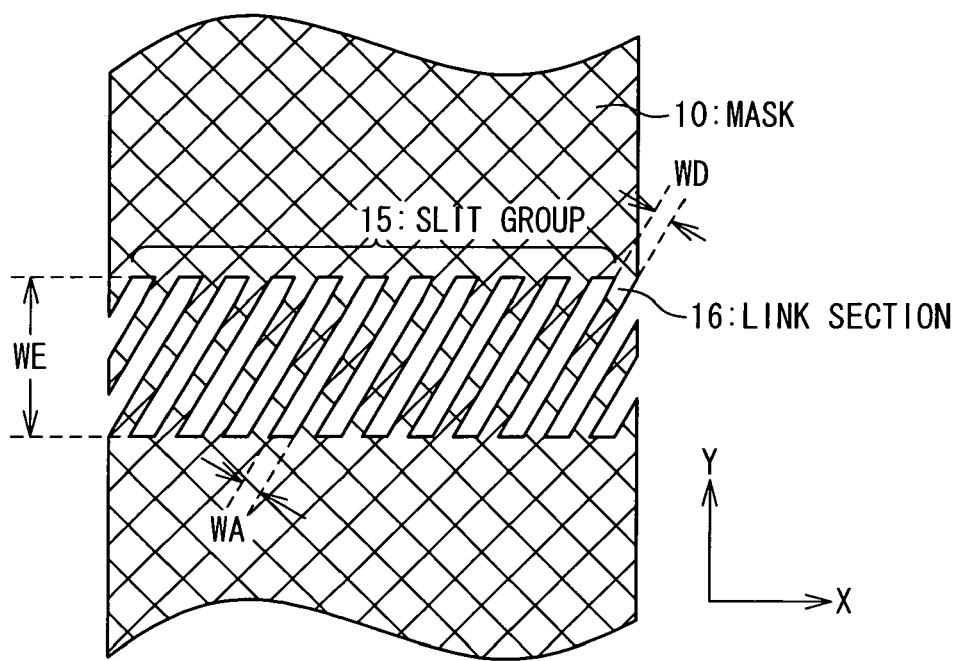
FIG. 15 is a plan view showing another modification example of a mask according to the third embodiment of the present invention.

FIG. 15 is a plan view showing another modification example. The mask 10 in the present modification example also has the slit group 15 which includes a plurality of slits arranged parallel to each other. The longitudinal direction of each slit can be an arbitrary direction. A width WA of each slit is smaller than R times the minimum dimension. Additionally, a portion between adjacent slits serves as the link section 16. A width WD between the adjacent slits, namely a width of the link section 16 is also smaller than R times the minimum dimension. It is preferable that a width WE in the Y-direction of whole of the slit group 15 is sufficiently larger than R times the minimum dimension. With the present modification example, the same effect as in the case of the mask 10 shown in FIG. 12 can be also obtained.

Figure 16:
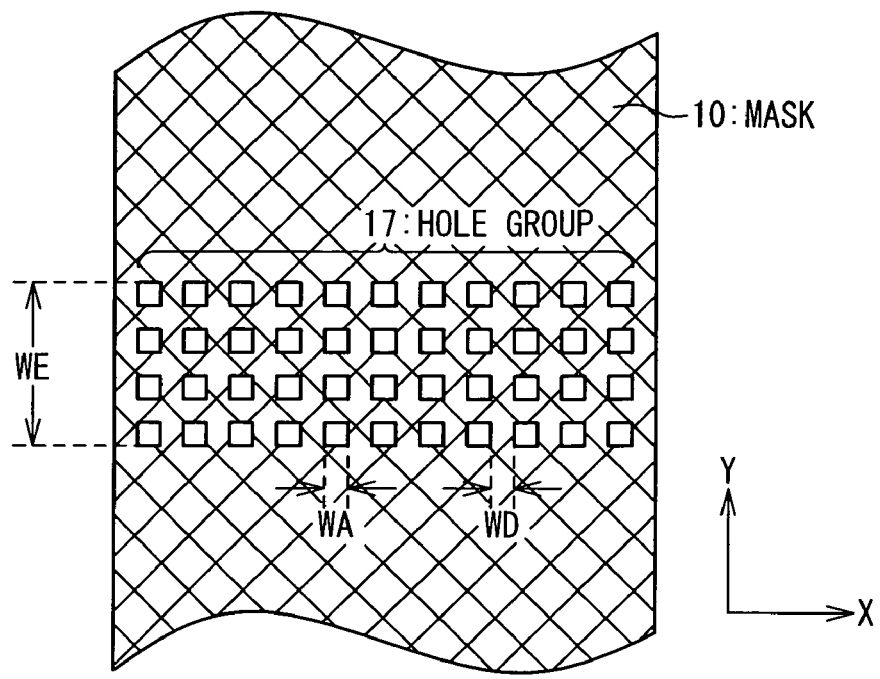
FIG. 16 is a plan view showing still another modification example of a mask according to the third embodiment of the present invention.

FIG. 16 is a plan view showing still another modification example. The mask 10 in the present modification example has a hole group 17 as the translucent section which includes a plurality of holes. The hole group 17 as a whole is formed to cross the mask 10 in the X-direction, namely, to be distributed along the X-direction. Each of the plurality of holes is formed to have a quadrilateral shape with a dimension WA being smaller than R times the minimum dimension specified in the design rule. Therefore, in the case of the normal exposure, the hole group 17 does not affect the interconnection 30 to be formed. On the other hand, in the case of the over-exposure, the hole group 17 is developed and reflected in the interconnection 30 to be formed.

In the present modification example, a portion between adjacent holes serves as the link section 16. A width WD between the adjacent holes is also designed to be smaller than R times the minimum dimension. Therefore, in the case of the over-exposure, the influence of the portion between the adjacent holes on the interconnection 30 disappears. As a result, the interconnection 30 is disconnected at the time of the over-exposure with the second exposure amount (see FIG. 13). It is preferable that a width WE in the Y-direction of whole distribution of the hole group 17 is sufficiently larger than R times the minimum dimension. With the present modification example, the same effect as in the case of the mask 10 shown in FIG. 12 can be also obtained.

Figure 17:
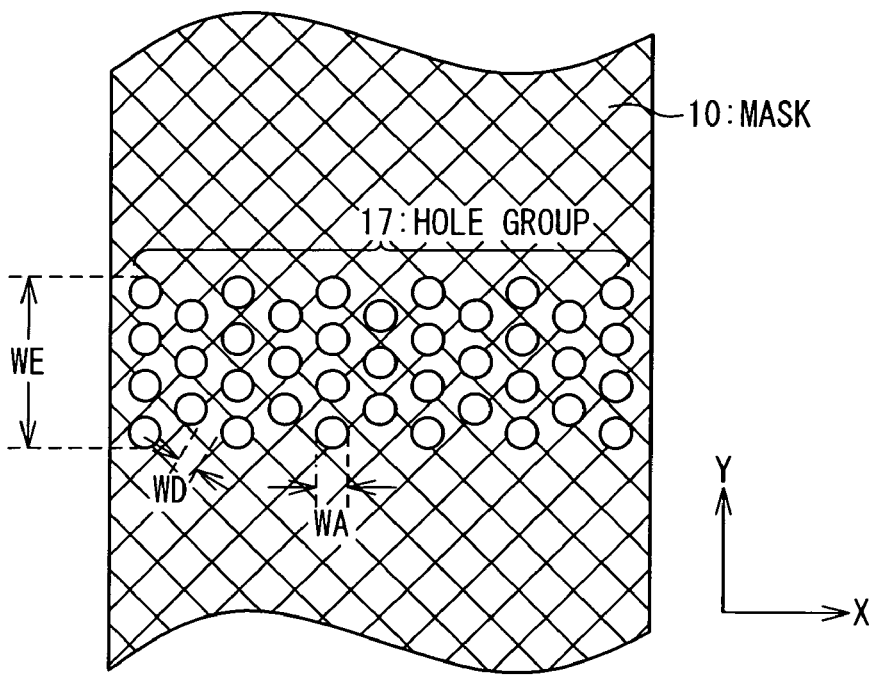
FIG. 17 is a plan view showing still another modification example of a mask according to the third embodiment of the present invention.
Figure 18:
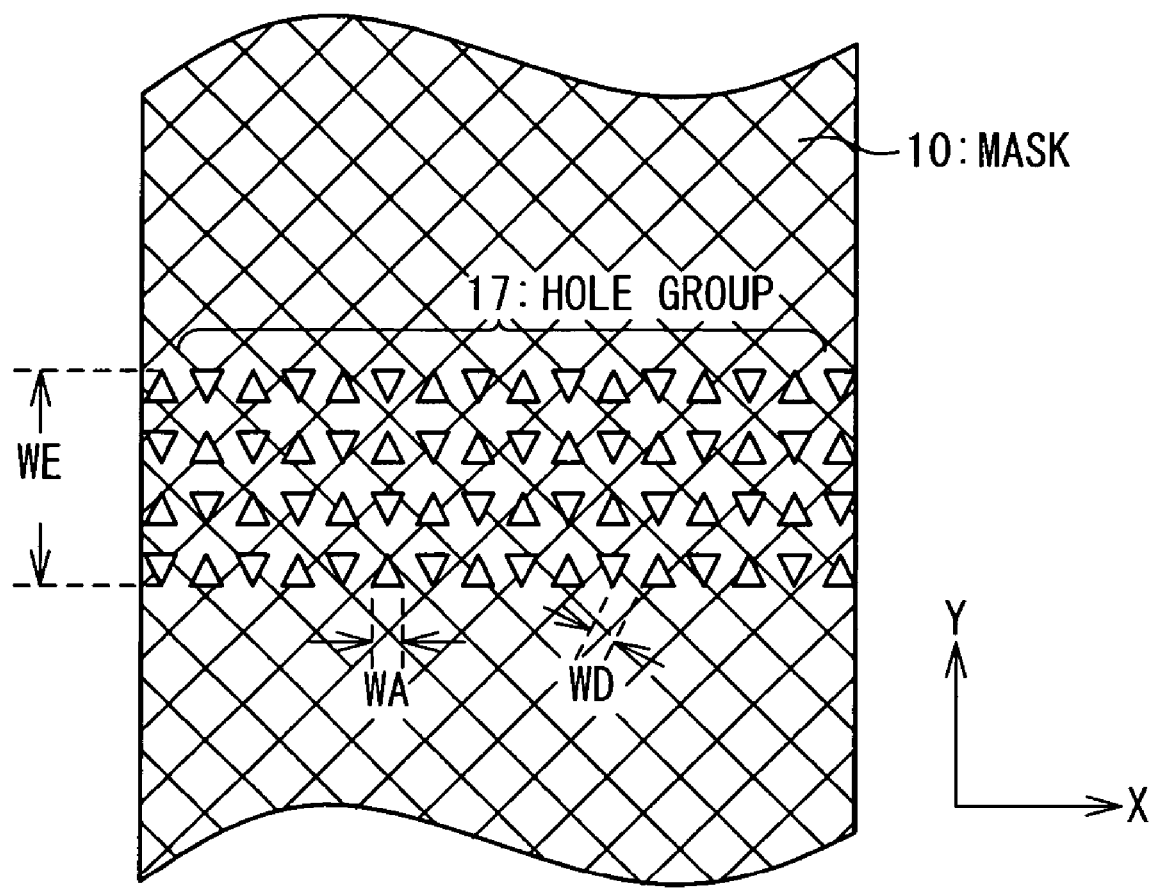
FIG. 18 is a plan view showing still another modification example of a mask according to the third embodiment of the present invention.

The shape of each hole is not limited to the quadrilateral shape. The shape of each hole may be a round shape as shown in FIG. 17, or a triangular shape as shown in FIG. 18. Alternatively, the shape may be a hexagonal shape (not shown). Any shape may be considered for the shape of each hole. In any case, the size WA of each hole is designed to be smaller than R times the minimum dimension. Also, the width WD between the adjacent holes is designed to be smaller than R times the minimum dimension. The width WE in the Y-direction of the whole distribution of the hole group 17 is designed to be larger than R times the minimum dimension.

According to the present invention, the translucent section of the mask 10 is reflected in the resist mask 45 and hence the interconnection 30 is disconnected in the case of the over-exposure, as described above. It is thus possible in the wafer process prior to the wafer probe test to make the interconnection 30 at a predetermined position in the unavailable chip 51 non-conductive. As a result, the problem during the wafer probe test can be solved. On the other hand, in the case of the normal exposure, the translucent section of the mask 10 is not reflected at all in the interconnection 30. In other words, it is possible to form the interconnection 30 with the full width in the available chip 50. Since a part of the power supply interconnection 30 does not become thin, the disconnection due to the electro-migration can be prevented. It is therefore possible to prevent the deterioration of the product reliability. Furthermore, the decrease in the throughput is prevented since the change of the reticle and the operation of the reticle blind are not necessary.

It is apparent that the present invention is not limited to the above embodiment, and that may be modified and changed without departing from the scope and spirit of the invention.

What is claimed is:

1. A method of manufacturing a semiconductor device comprising:
    (A) applying a photo-resist over a wafer;
    (B) forming a first reacted portion in said photo-resist by exposing a first region of said wafer to light having a first exposure amount through a mask pattern in a region of a mask, and forming a second reacted portion in said photo-resist by exposing a second region of said wafer to light having a second exposure amount through said mask pattern in said region of said mask; and
    (C) forming a resist mask having an opening portion by dissolving said first reacted portion and said second reacted portion,
    wherein:
    said opening portion does not penetrate said photo-resist in said first region while said opening portion penetrates said photo-resist in said second region.

2. The method according to claim 1,
    wherein said photo-resist is applied onto an interconnection film formed on said wafer, and
    wherein said opening portion in said first region does not reach said interconnection film, while said opening portion in said second region reaches said interconnection.

3. The method according to claim 2, further comprising:
    (D) forming an interconnection extending in a first direction by etching said interconnection film by using said resist mask, wherein said interconnection is disconnected at a portion corresponding to said second reacted portion but not disconnected at a portion corresponding to said first reacted portion.

4. The method according to claim 3,
wherein said light passes through a projection lens with a reduction ratio of 1/R after passing through said mask, wherein:
R is a real number not less than 1,
said translucent section includes a slit whose longitudinal direction is a second direction orthogonal to said first direction, and
a width in said first direction of said slit is smaller than R times a minimum dimension specified in a design rule.

5. The method according to claim 4,
wherein a width in said second direction of said slit is substantially equal to R times a width in said second direction of said interconnection.

6. The method according to claim 4,
wherein a width in said second direction of said slit is smaller than R times a width in said second direction of said interconnection,
wherein said mask has a link section crossing said slit, and a width in said second direction of said link section is smaller than R times said minimum dimension.

7. The method according to claim 3,
wherein said light passes through a projection lens with a reduction ratio of 1/R after passing through said mask,
wherein R is a real number not less than 1,
wherein said translucent section includes a plurality of slits formed parallel to each other, and a longitudinal direction of each of said plurality of slits is a second direction orthogonal to said first direction, and
wherein a width in said first direction of said each slit is smaller than R times a minimum dimension specified in a design rule, and a width between adjacent slits of said plurality of slits is smaller than R times said minimum dimension.

8. The method according to claim 7,
wherein said mask has a link section crossing said plurality of slits, and a width in said second direction of said link section is smaller than R times said minimum dimension.

9. The method according to claim 7, wherein a width in said first direction of whole of said plurality of slits is larger than R times said minimum dimension.

10. The method according to claim 3,
wherein said light passes through a projection lens with a reduction ratio of 1/R after passing through said mask,
wherein R is a real number not less than 1,
wherein said translucent section includes a plurality of slits formed parallel to each other, and a longitudinal direction of each of said plurality of slits is said first direction,
wherein a width of said each slit in a direction orthogonal to said first direction is smaller than R times a minimum dimension specified in a design rule, and a width between adjacent slits of said plurality of slits is smaller than R times said minimum dimension.

11. The method according to claim 3,
wherein said light passes through a projection lens with a reduction ratio of 1/R after passing through said mask,
wherein R is a real number not less than 1,
wherein said translucent section includes a plurality of slits formed parallel to each other, and a longitudinal direction of each of said plurality of slits is a third direction, and
wherein a width of said each slit in a direction orthogonal to said third direction is smaller than R times a minimum dimension specified in a design rule, and a width between adjacent slits of said plurality of slits is smaller than R times said minimum dimension.

12. The method according to claim 3,
wherein said light passes through a projection lens with a reduction ratio of 1/R after passing through said mask,
wherein R is a real number not less than 1,
wherein said translucent section includes a plurality of holes which are distributed along a second direction orthogonal to said first direction,
wherein a size of each of said plurality of holes is smaller than R times a minimum dimension specified in a design rule, and a width between adjacent holes of said plurality of holes is smaller than R times said minimum dimension.

13. The method according to claim 12, wherein a width in said first direction of whole of said plurality of holes is larger than R times said minimum dimension.

14. The method according to claim 3,
wherein said wafer comprises:
said first region in which available semiconductor chips are formed; and
said second region in which unavailable semiconductor chips are formed, and
wherein the second exposure amount is greater than the first exposure amount.

15. The method according to claim 14,
wherein said (B) process includes:
(b1) exposing whole of said wafer to said light with said first exposure amount; and
(b2) exposing only said second region to said light.

16. The method according to claim 14, wherein said disconnected portion of said interconnection is located between an internal circuit and a pad used for a probe test.

17. The method according to claim 16, further comprising:
(E) carrying out said probe test by using said interconnection.

18. The method according to claim 1,
wherein said wafer comprises:
said first region in which available semiconductor chips are formed; and
said second region in which unavailable semiconductor chips are formed, and
wherein the second exposure amount is greater than the first exposure amount.

19. A method of manufacturing a semiconductor device comprising:
carrying out a first exposure through a mask pattern in a region of a mask with a first energy such that a photo-resist in a first region on a wafer is not penetrated; and
carrying out a second exposure through said mask pattern in said region of said mask with a second energy different from said first energy such that a photo-resist in a second region different from said first region on said wafer is penetrated.

20. The method according to claim 19 comprising:
repeating an exposure with respect to a plurality of chips as a unit on said wafer; and
carrying out an additional exposure as said second exposure with respect to a part of said plurality of chips such that said additional exposure is not performed with respect to the other part of said plurality of chips.

21. The method according to claim 19,
wherein said wafer comprises:

said first region in which available semiconductor chips are formed; and said second region in which unavailable semiconductor chips are formed, and wherein the second exposure amount is greater than the first exposure amount.

22. A method of manufacturing a semiconductor device comprising:

applying a photo-resist over a wafer;

forming a first pattern and a second pattern without overlapping each other on said photo-resist, wherein the first pattern is formed by carrying out a first exposure using a first exposure amount, and the second pattern is formed by carrying out a second exposure using a second exposure amount;

forming a pad connected to an internal circuit through an interconnection by etching an interconnection film of the wafer using said first pattern as an etch mask with respect to chips in a first region of a plurality of chips on a wafer; and forming a pad disconnected from an internal circuit by etching the interconnection film of the wafer using said second pattern as an etch mask with respect to chips in a second region of said plurality of chips.

23. The method according to claim 22, wherein said wafer comprises:

said first region in which available semiconductor chips are formed; and said second region in which unavailable semiconductor chips are formed, and wherein the second exposure amount is greater than the first exposure amount.

* * * * *